US012672301B2

(12) United States Patent (10) Patent No.: US 12,672,301 B2

Jimenez et al. (45) Date of Patent: *Jun. 30, 2026

(54) HIGH ELECTRON MOBILITY TRANSISTOR DEVICE HAVING AN ALUMINUM-DOPED BUFFER LAYER

(71) Applicant: Qorvo US, Inc., Greensboro, NC (US)

(72) Inventors: Jose Jimenez, Dallas, TX (US); Jinqiao Xie, Allen, TX (US); Vipan Kumar, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/762,775

(22) Filed: Jul. 3, 2024

(65) Prior Publication Data

US 2024/0355917 A1 Oct. 24, 2024

Related U.S. Application Data

(63) Continuation of application No. 17/477,657, filed on Sep. 17, 2021, now Pat. No. 12,074,214.

(60) Provisional application No. 63/126,837, filed on Dec. 17, 2020.

(51) Int. Cl.
H10D 30/47 (2025.01)
H10D 62/13 (2025.01)

(52) U.S. Cl.
CPC ....... H10D 30/4732 (2025.01); H10D 62/151 (2025.01)

(58) Field of Classification Search
None
See application file for complete search history.

(56) References Cited

U.S. PATENT DOCUMENTS 12,074,214 B2 * 8/2024 Jimenez ............. H10D 30/4732
2006/0049426 A1 3/2006 Lee et al.
(Continued)

FOREIGN PATENT DOCUMENTS

JP H05190577 A * 7/1993
JP 200031200 A 11/2000
JP 2003273029 A 9/2003
(Continued)

OTHER PUBLICATIONS

Non-Final Office Action for U.S. Appl. No. 17/477,657, mailed Mar. 2, 2023, 13 pages.
(Continued)

*Primary Examiner* — Cory W Eskridge
(74) *Attorney, Agent, or Firm* — Withrow & Terranova, P.L.L.C.

(57) ABSTRACT

A high electron mobility transistor (HEMT) device is disclosed. The HEMT device includes a substrate with epitaxial layers over the substrate that includes a buffer layer having a dopant comprising aluminum, wherein the concentration of aluminum within the buffer layer is between 0.5% and 3%. The epitaxial layer further includes a channel layer over the buffer layer and a barrier layer over the channel layer. A gate contact is disposed on a surface of the epitaxial layers. A source contact and a drain contact are also disposed on the surface of the epitaxial layers, wherein the source contact and the drain contact are spaced apart from the gate contact and each other.

21 Claims, 7 Drawing Sheets

(56) References Cited

U.S. PATENT DOCUMENTS

| | | | |
|---|---|---|---|
| 2010/0084687 A1* | 4/2010 | Chen | H10D 62/854 |
| | | | 257/E21.403 |
| 2014/0252369 A1 | 9/2014 | Lee et al. | |

FOREIGN PATENT DOCUMENTS

| | | |
|---|---|---|
| JP | 2016512937 A | 5/2016 |
| JP | 2016111288 A | 6/2016 |
| JP | 2018182247 A | 11/2018 |
| JP | 201921704 A | 2/2019 |
| KR | 20180075525 A | 7/2018 |
| WO | 2017077989 A1 | 5/2017 |
| WO | 2019151441 A1 | 8/2019 |

OTHER PUBLICATIONS

Final Office Action for U.S. Appl. No. 17/477,657, mailed Aug. 8, 2023, 11 pages.

Advisory Action for U.S. Appl. No. 17/477,657, mailed Sep. 21, 2023, 3 pages.

Non-Final Office Action for U.S. Appl. No. 17/477,657, mailed Dec. 7, 2023, 10 pages.

Notice of Allowance for U.S. Appl. No. 17/477,657, mailed May 13, 2024, 8 pages.

Extended European Search Report for European Patent Application No. 21211324.5, mailed Apr. 28, 2022, 8 pages.

Decision to Grant for Japanese Patent Application No. 2021204136, mailed Jan. 6, 2025, 5 pages.

Written Decision on Registration for Korean Patent Application No. 10-2021-0181286, mailed Jul. 10, 2025, 11 pages.

Office Action for Japanese Patent Application No. 2025-008961, mailed Dec. 17, 2025, 11 pages.

Request for the Submission of an Opinion for Korean Patent Application No. 10-2025-0144793, mailed Feb. 20, 2026, 11 pages.

* cited by examiner

| ID$_{AVERAGE}$/ID$_{NO\_PULSE}$ | | |
|---|---|---|
| VG-RX | NO IRON | IRON |
| -4V | 99.14% | 97.10% |
| -6V | 98.40% | 71.16% |
| -8V | 91.62% | 37.78% |
| -10V | 79.04% | 15.37% |
| ID$_{4.5ms}$/ID$_{0.5ms}$ | | |
| VG-RX | NO IRON | IRON |
| -4V | 100.00% | 92.67% |
| -6V | 99.38% | 84.22% |
| -8V | 96.43% | 81.87% |
| -10V | 94.36% | 80.74% |

| ID$_{AVERAGE}$/ID$_{NO\_PULSE}$ | | | |
|---|---|---|---|
| VG-RX | 0% | 1% | 2% |
| -4V | 100.00% | 100.00% | 98.22% |
| -6V | 100.00% | 99.75% | 95.62% |
| -8V | 99.51% | 98.50% | 86.26% |
| -10V | 97.04% | 94.87% | 70.26% |
| ID$_{4.5ms}$/ID$_{0.5ms}$ | | | |
| VG-RX | 0% | 1% | 2% |
| -4V | 100.00% | 100.00% | 99.76% |
| -6V | 100.00% | 99.63% | 98.77% |
| -8V | 99.88% | 97.98% | 95.95% |
| -10V | 98.36% | 95.58% | 94.24% |

HIGH ELECTRON MOBILITY TRANSISTOR DEVICE HAVING AN ALUMINUM-DOPED BUFFER LAYER

RELATED APPLICATIONS

This application is a continuation of U.S. patent application Ser. No. 17/477,657, filed Sep. 17, 2021, now U.S. Pat. No. 12,074,214, which claims the benefit of provisional patent application Ser. No. 63/126,837, filed Dec. 17, 2020, the disclosure of which is hereby incorporated herein by reference in its entirety.

FIELD OF THE DISCLOSURE

The present disclosure relates to a high electron mobility transistor device having a buffer layer that provides improved linearity.

BACKGROUND

Radio frequency (RF) spectrum is becoming more crowded. As such, increasing amplifier linearity is highly desirable to share the crowded RF spectrum. At least one problem that reduces linearity in amplifiers is undoped gallium nitride buffers that are normally n-type due to the unwanted intrusion of silicon or oxygen during epitaxial growth of the gallium nitride buffers. An n-type gallium nitride buffer typically results in leaky gallium nitride high electron mobility transistor devices with very poor RF performance. What is needed is a high electron mobility transistor device having a buffer layer that eliminates leakage and thus provides improved linearity.

SUMMARY

A high electron mobility transistor (HEMT) device is disclosed. The HEMT device includes a substrate with epitaxial layers over the substrate that include a buffer layer having a dopant comprising aluminum, wherein the concentration of aluminum within the buffer layer is between 0.5% and 3%. The epitaxial layer further includes a channel layer over the buffer layer and a barrier layer over the channel layer. A gate contact is disposed on a surface of the epitaxial layers. A source contact and a drain contact are also disposed on the surface of the epitaxial layers, wherein the source contact and the drain contact are spaced apart from the gate contact and each other.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
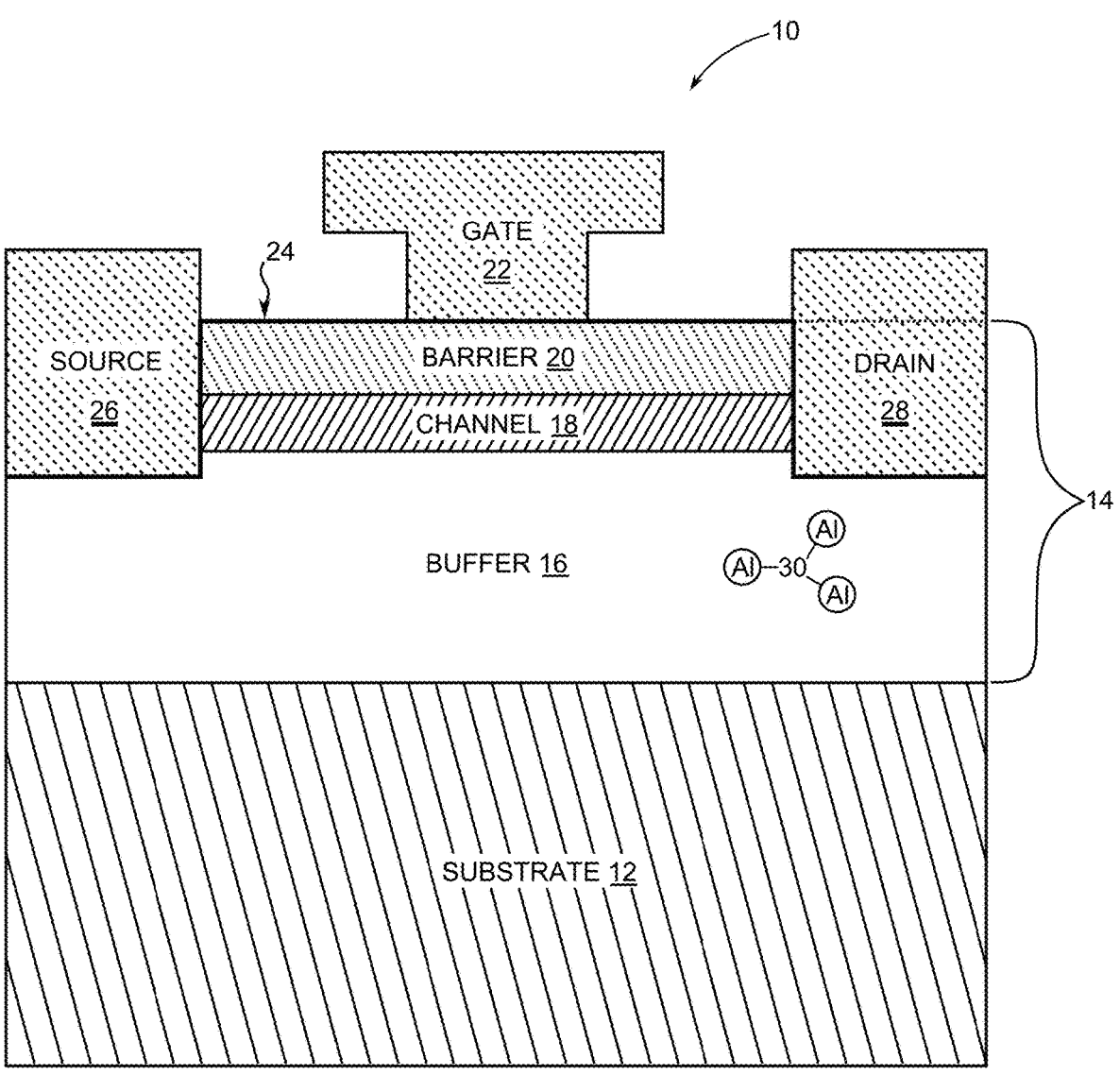
FIG. 1 is a cross-sectional diagram of a high electron mobility transistor (HEMT) device that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Undoped gallium nitride (GaN) buffers are normally n-type due to the unwanted incorporation of silicon (Si) or oxygen (O), two known shallow donors, during epitaxial growth. A n-type GaN buffer result in leaky GaN field-effect transistor (FET) devices with very poor radio frequency (RF) performance.

To reduce leakage in the GaN buffer, device technologists introduce a deep trap during growth. The two most common deep-level traps used for this purpose during epitaxial growth are carbon and iron. For example, iron is a relatively fast trap but shows growth memory, that is, the incorporation of iron in the buffer cannot be switched abruptly. This has the detrimental consequence of having to add more deep-level traps in the buffer than needed. In contrast, carbon is a slower trap. Carbon does not display growth memory but a carbon incorporation amount in the buffer is controlled by growth conditions including temperature, growth rate, and V/III ratio. Given that an optimized growth window for achieving the highest crystal quality of gallium nitride buffer is relatively small, control of carbon doping to the desired level becomes very challenging.

Deep-level traps have the positive property of suppressing leakage between the drain and source side of the high electron mobility transistor device, producing higher performance RF devices. Deep-level traps have the negative property of slow detrapping, when subjected to a receive and transmit events, creating an unwanted dynamic in the quiescent drain current condition of the device.

The dynamics on the receive and transmit switching events are particularly detrimental in the context of a time domain duplexing basestation application because of dynamic changes in transconductance that the device experiences as operation of the device progresses to reach the steady state drain quiescent current. These dynamic changes in transconductance complicate the application of digital predistortion algorithms which are used to linearize gallium nitride amplifiers. The result is a high electron mobility transistor device that is difficult to linearize and thus of limited information transmission capacity.

Ultimately, the number of deep-level traps in the buffer layer and the detrapping times associated with them are what determine how a particular device can be used. For applications without transmit and receive switching, iron deep-level traps are preferred because iron deep-level traps decouple the growth temperature and quality of the buffer layer from the amount of insulation needed in the buffer layer. For applications with transmit and receive switching, a carbon-doped buffer layer is preferred, since the carbon-doped layer does not require as many deep-level traps (instantaneous switching at growth) and does not result in detrapping dynamics interfering with the baseband signal being transmitted (very slow detrapping time), at the expense of a lower quality, less controllable buffer layer.

In this disclosure, a novel insulating buffer having the benefits of temperature-decoupling and high controllability of iron and the abrupt switching growth and slow detrapping times of carbon is disclosed.

In particular, a substitution is made for the typical carbon or iron deep-level traps with an aluminum-oxygen complex and other native defects produced through the doping of the buffer using a diluted aluminum dopant. The main advantages of using aluminum instead of carbon or iron are the following:

As with carbon, the aluminum-oxygen complex is a very slow trap, preventing any aliasing of the detrapping dynamics and the information dynamics. Also, as with carbon, the profile of the aluminum-oxygen complex can be abruptly changed, thereby eliminating the need to add more traps than typically used. In contrast with carbon, the control of the aluminum-oxygen can be achieved though a trimethylaluminum flow without altering other growth conditions. The control of the aluminum-oxygen with trimethylaluminum flow decouples the intrusion of deep-level traps from the growth conditions of the buffer, and thus the overall buffer quality is retained.

In short, the replacement of carbon and iron with aluminum produces low concentration deep-level trap devices with superior transmit/receive switching characteristics controlled through a more manufacturable growth process that does not use growth conditions to control the number of traps.

FIG. 1 is a cross-sectional diagram of a high electron mobility transistor (HEMT) device 10 that is structured in accordance with the present disclosure. The HEMT device 10 has a substrate 12 and epitaxial layers 14 over the substrate 12. The epitaxial layers 14 includes a buffer layer 16, a channel layer 18 over the buffer layer 16, a barrier layer 20 over the channel layer 18. The HEMT device 10 also includes a gate contact 22 that is disposed on a surface 24 of the epitaxial layers 14. Further included is a source contact 26 that is disposed over the surface 24 of the epitaxial layers 14 and a drain contact 28 that is disposed on the surface 24 of the epitaxial layers 18, wherein the source contact 26 and the drain contact 28 are spaced apart from the gate contact 22 and each other. In exemplary embodiments, the buffer layer 16 is made of gallium nitride that has a dopant 30 that comprises aluminum. In some of the exemplary embodiments, the concentration of aluminum within the buffer layer 16 due to the dopant 30 is between 0.5% and 3%. In some other ones of the exemplary embodiments, the concentration of aluminum within the buffer layer 16 due to the dopant 30 is between 0.5% and 0.75%. In yet other ones of the exemplary embodiments, the concentration of aluminum within the buffer layer 16 due to the dopant 30 is between 0.75% and 1.25%. In still other ones of the exemplary embodiments, the concentration of aluminum within the buffer layer 16 due to the dopant 30 is between 1.25% and 2%. In further ones of the exemplary embodiments, the concentration of aluminum within the buffer layer 16 due to the dopant 30 is between 2% and 3%.

Figure 2:
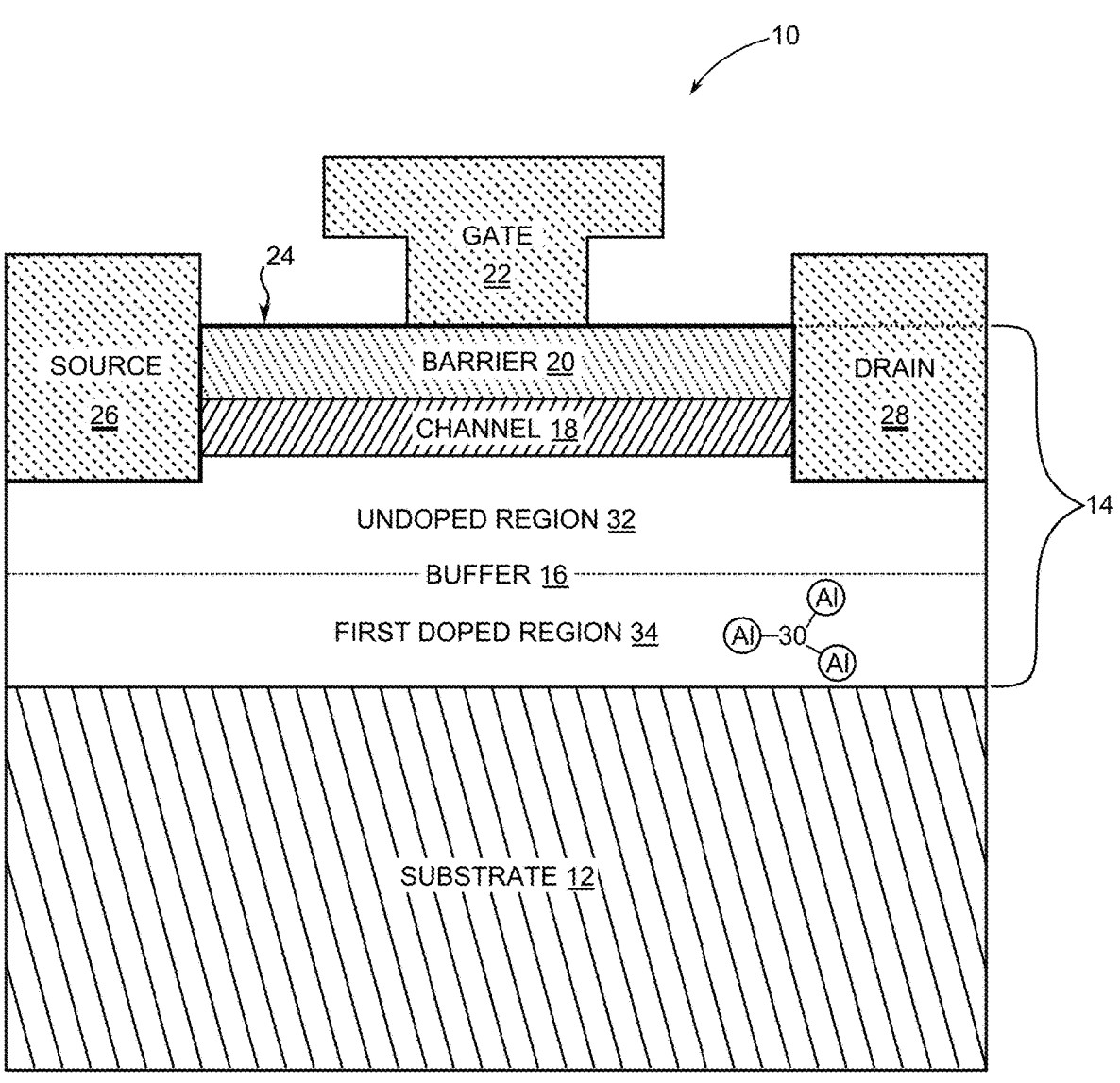
FIG. 2 is a cross-sectional diagram of an exemplary embodiment of the HEMT device, wherein the buffer layer is laterally divided into an undoped region and a first doped region having the dopant comprising aluminum.
Figure 3:
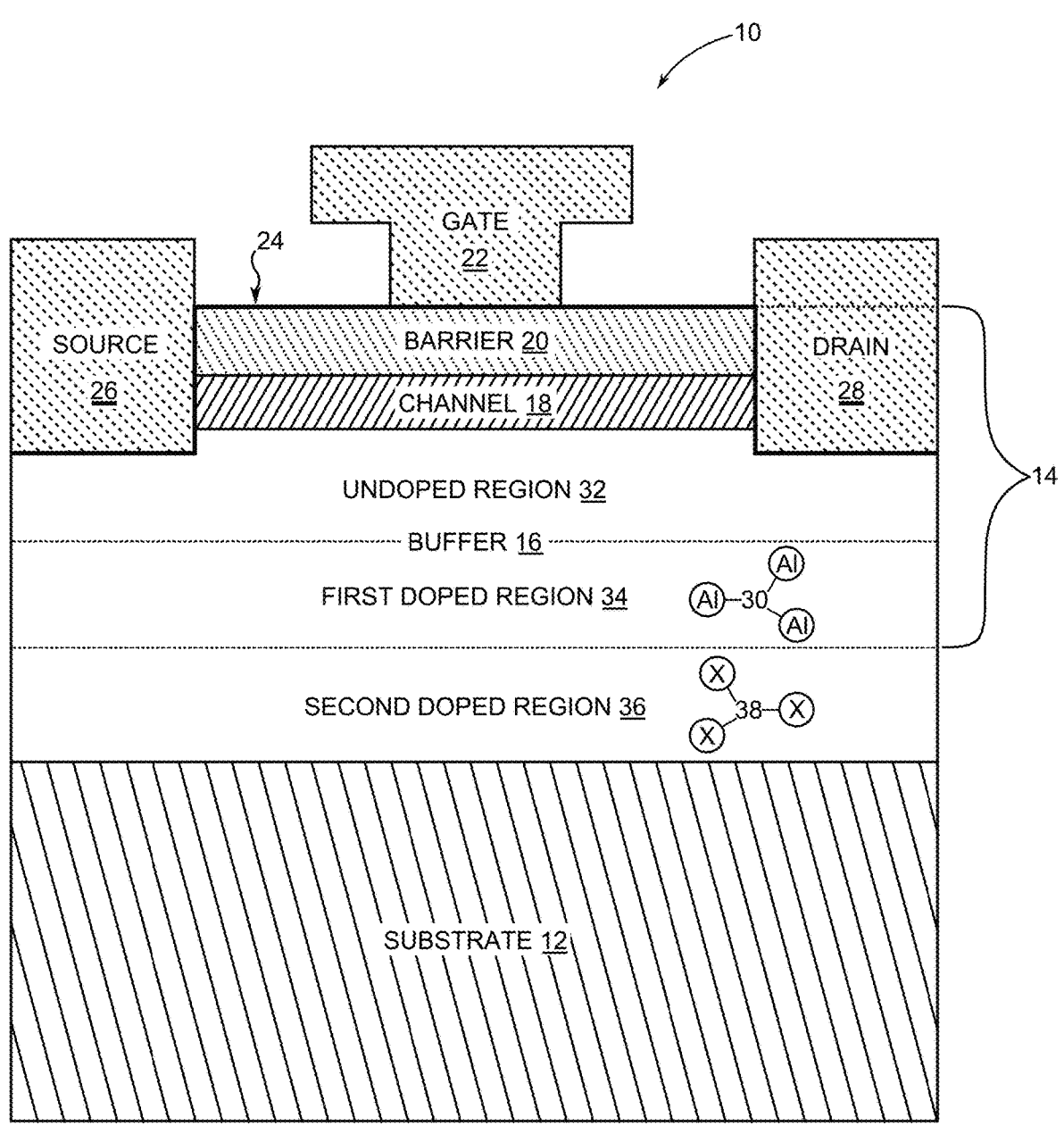
FIG. 3 is a cross-sectional diagram of another exemplary embodiment, wherein the buffer layer has a second doped region having a non-aluminum dopant such as iron or carbon.

In some exemplary embodiments, as depicted in FIG. 2, the buffer layer 16 is laterally divided into an undoped region 32 and a first doped region 34 having the dopant 30 comprising aluminum. As depicted in FIG. 3, in other exemplary embodiments, the buffer layer 16 has a second doped region 36 having a non-aluminum dopant 38, represented in FIG. 3 with the letter X. In these exemplary embodiments, the undoped region 32 is adjacent to the channel layer 18, and the first doped region 34 is sandwiched between the undoped region 32 and the second doped region 34. In some exemplary embodiments, the non-aluminum dopant 38 is carbon. In other exemplary embodiments, the non-aluminum dopant 38 is iron.

Figure 4:
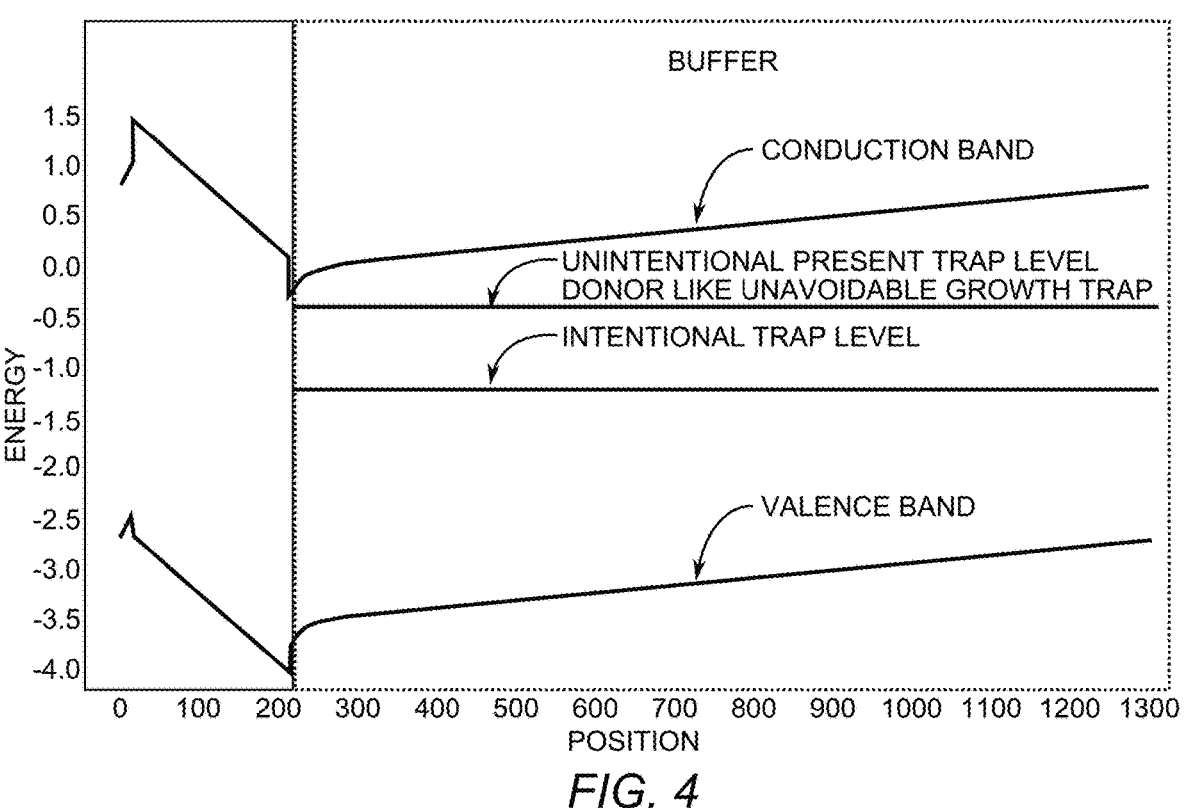
FIG. 4 is a band diagram of a typical semiconductor structure of a field-effect transistor.

FIG. 4 is a band diagram of a typical semiconductor structure of a field-effect transistor. Notice the energy of the unintentionally present donor state. The black line represents the intentionally added deep trap that makes the buffer insulating. The number of intentionally added deep traps should be larger than that of the unintentionally present donor state. Otherwise, the buffer will be conductive and cannot be used for RF applications.

Figure 5:
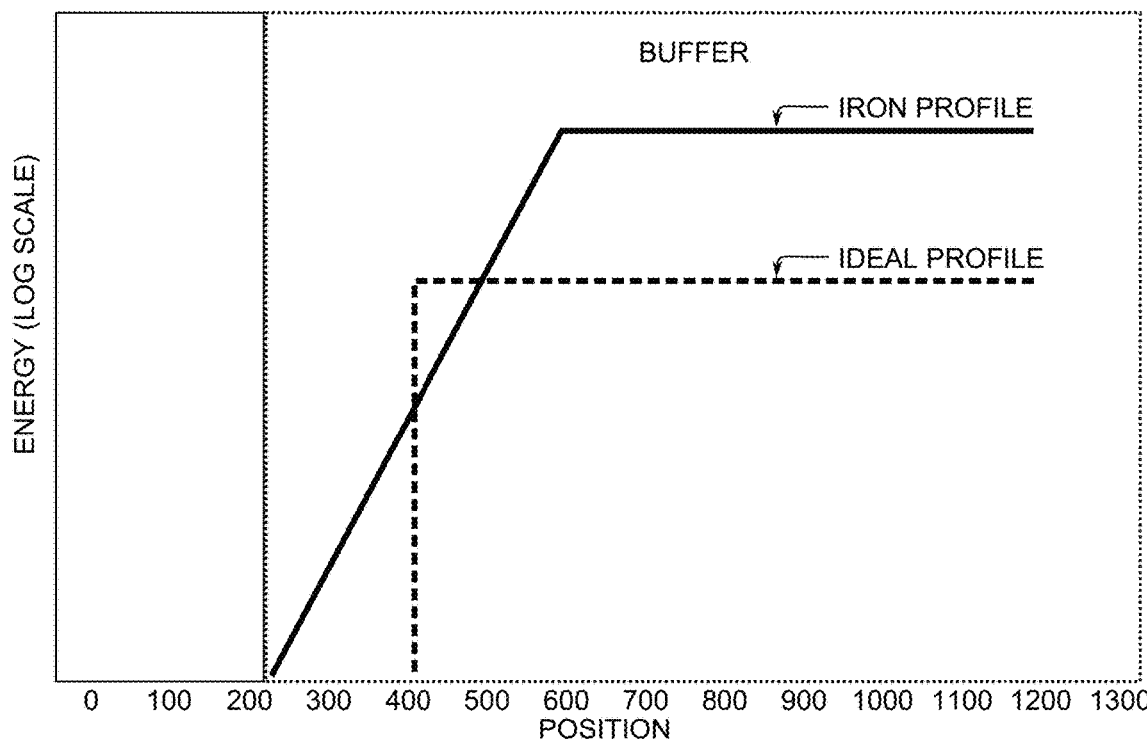
FIG. 5 is a typical deep trap profile on a gallium nitride (GaN) buffer using iron traps.

FIG. 5 is a typical deep trap profile on a GaN buffer using iron traps, which are represented by a solid line profile. Due to growth memory effects, the concentration of iron cannot be sharply turned off. An ideal trap profile shown in dashed line in FIG. 5 has a sharp profile. This sharper profile can be achieved with carbon or using an aluminum-oxygen complex present in aluminum-diluted GaN buffers. Using carbon, however, requires the change of growth conditions affecting, among others, a breakdown of a field-effect transistor constructed on the buffer.

Figures 6A, 6B, 6C:
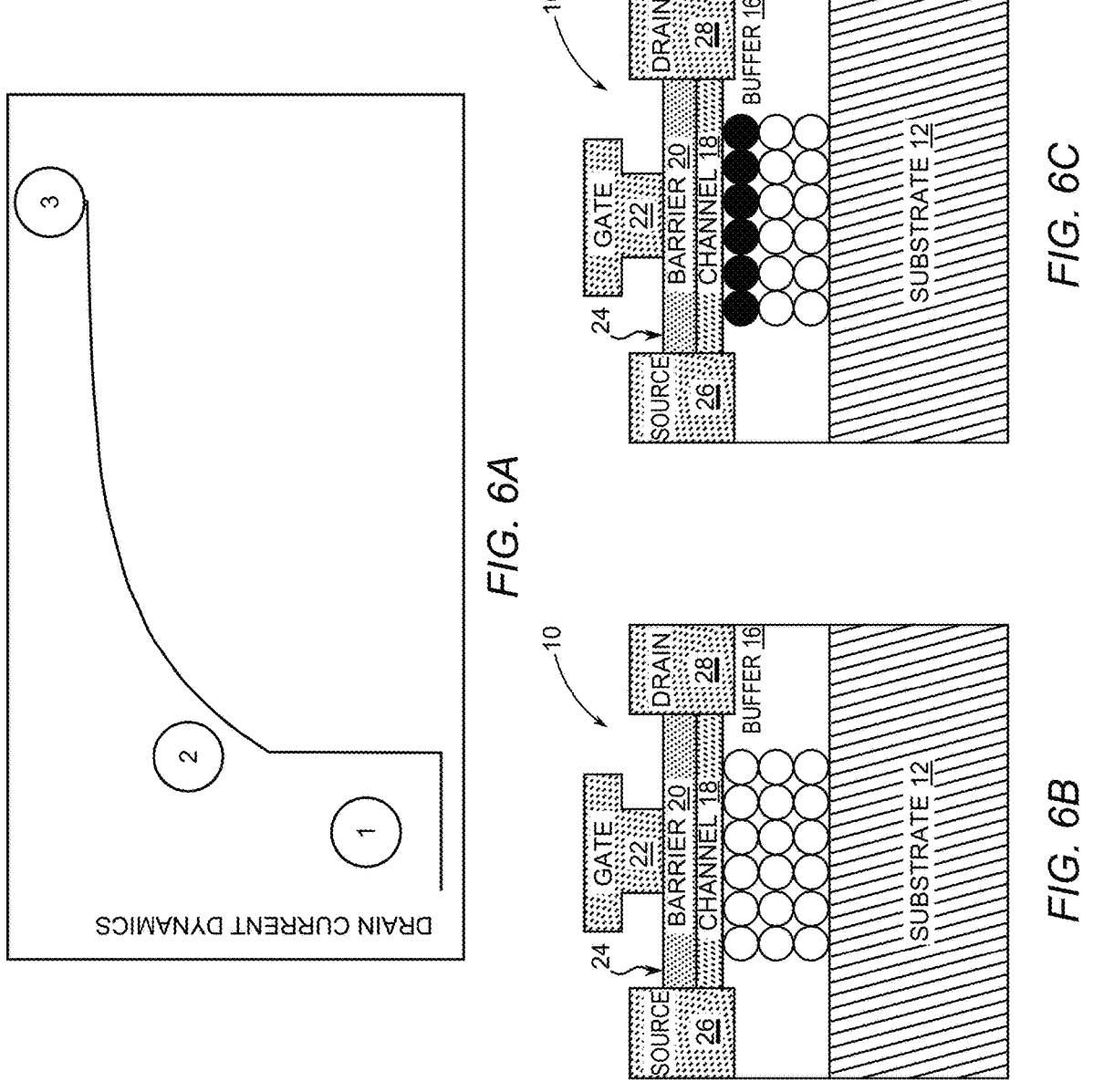
FIG. 6A illustrates drain current dynamics on the HEMT device when operated as a gate voltage-controlled switch.
FIG. 6B is a cross-sectional diagram of the HEMT device wherein the traps in the buffer are not filled, represented by hollow dots.
FIG. 6C is a cross-sectional diagram of the HEMT device wherein the traps in the buffer are filled, represented by filled dots.

FIG. 6A illustrates drain current dynamics on the HEMT device 10 when operated as a gate voltage-controlled switch as depicted in FIGS. 6B and 6C. When gate voltage is in deep pinch off, no drain current is circulating through the channel layer 18. All the traps (black dots) in the buffer 16 are filled as depicted in FIG. 6C.

As depicted in FIG. 6A, when the gate voltage increases from state (1) to state (2), the drain current flowing from drain to source increases. The increase to the steady state (3) is not instantaneous since the traps take a certain time to detrap. It is this dynamic variation of drain current on a receive-transmit switching that makes digital predistortion linearization difficult. If there are too many traps, such as a 4% diluted Al dopant in the GaN buffer, the state (2) drain current starting point is very low and the device is difficult to linearize.

Figures 7A, 7B, 8A, 8B:
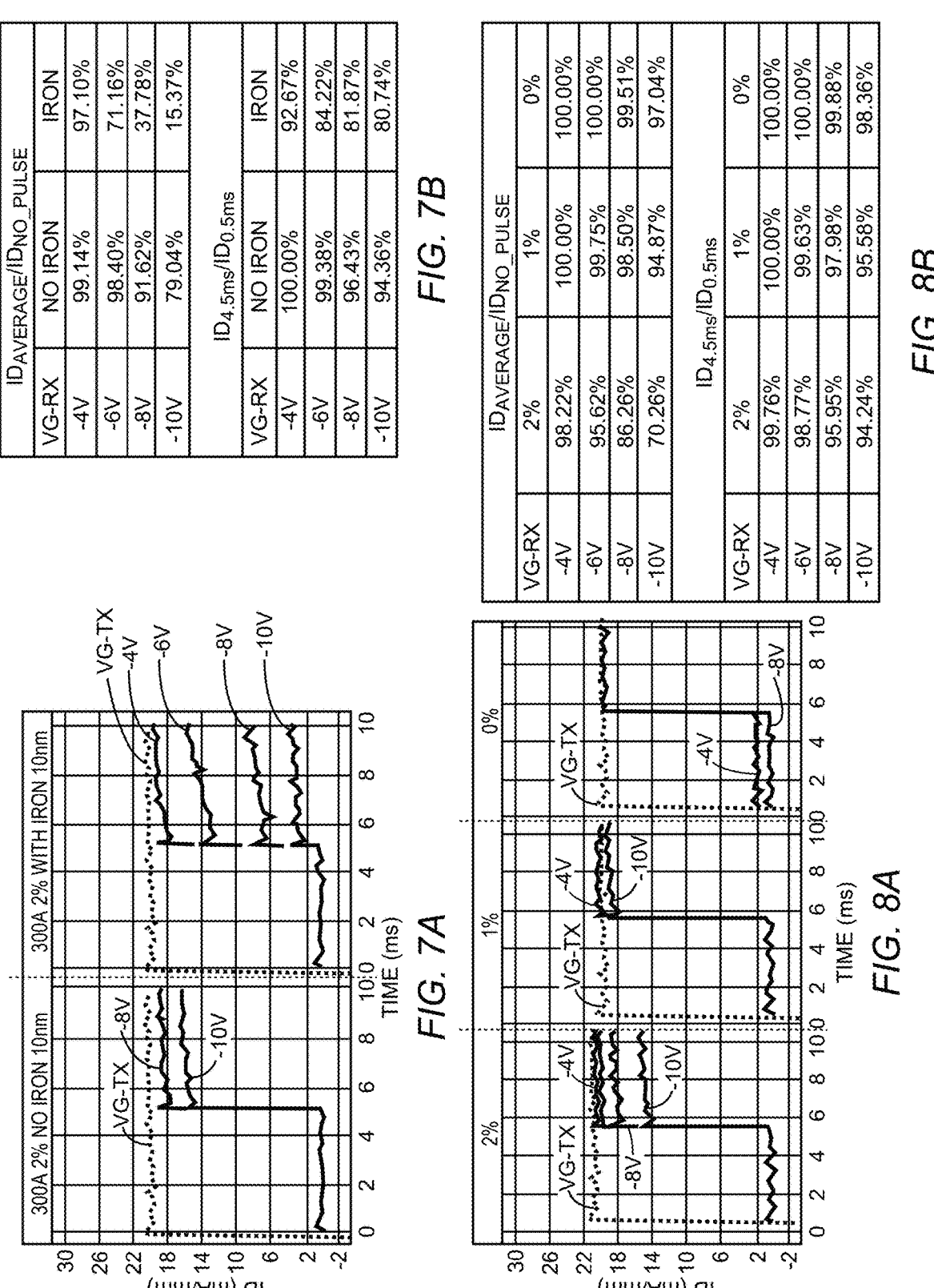
FIG. 7A is a graph that shows quiescent drain current dynamics of the HEMT device using a GaN buffer with a 2% diluted Al dopant.
FIG. 7B is a table summarizing the quiescent drain current dynamics depicted in the FIG. 7A graph.
FIG. 8A is a graph showing dynamics of a similarly structured device having iron deep traps instead of the aluminum dopant of the HEMT device of the present disclosure.
FIG. 8B is a table summarizing the quiescent drain current dynamics depicted in the FIG. 8A graph.

FIG. 7A is a graph that shows quiescent drain current dynamics of the HEMT device 10 using a GaN buffer with a 2% diluted Al dopant when subjected to a gate voltage (VG) 5 ms receive-transmit dynamics of −4 V to −10 V at a drain voltage (VD) of 48 V. The table in FIG. 7B summarizes the quiescent drain current dynamics depicted in FIG. 7A. For comparison purposes, FIG. 8A is a graph showing dynamics of a similarly structured device having iron deep traps instead of the aluminum dopant of the HEMT device 10. Those skilled in the art will recognize that the aluminum doped buffer shows a much-improved dynamics. The table in FIG. 8B summarizes the quiescent drain current dynamics depicted in FIG. 8A.

Figure 9:
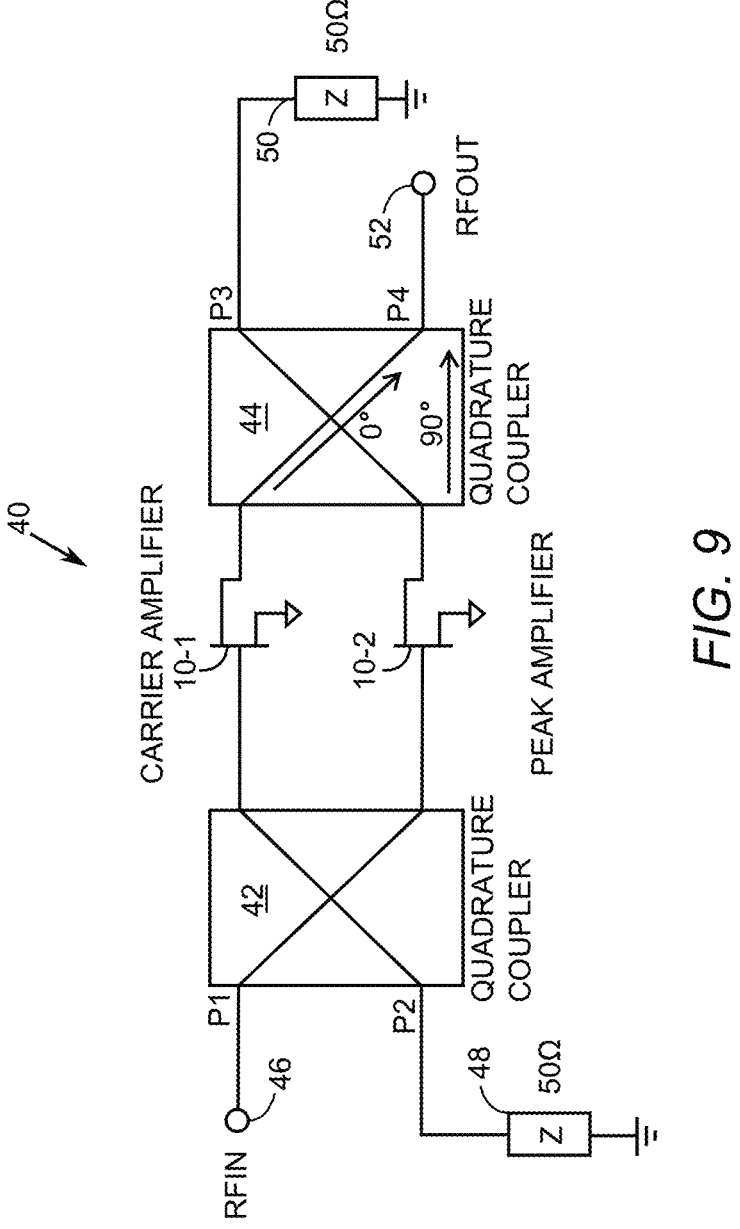
FIG. 9 depicts an amplifier in which a pair of HEMT devices are utilized as amplifying devices that are configured to amplify radio frequency signals in accordance with the present disclosure.

FIG. 9 depicts an amplifier 40 in which a pair of HEMT devices 10-1 and 10-2 are utilized as amplifying devices that are configured to amplify RF signals. In this exemplary embodiment the amplifier is a Doherty amplifier in which the HEMT device 10-1 operates as a carrier amplifier and the HEMT device 10-2 operates as a peak amplifier. In this exemplary embodiment, the pair of HEMT devices 10-1 and 10-2 are coupled between an input quadrature coupler 42 and an output quadrature coupler 44. A radio frequency signal input terminal 46 (RFIN) is coupled to a first port P1 of the input quadrature coupler 42, and an input termination impedance 48 is coupled to a second port P2 of the quadrature coupler 42. An input termination impedance 50 is coupled to a third port P3 of the output quadrature coupler 44, and a radio frequency signal output terminal 52 (RFOUT) is coupled to a fourth port P4 of the output quadrature coupler 44.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A high electron mobility transistor (HEMT) device comprising:
   a nonlayered substrate;
   epitaxial layers over the nonlayered substrate and comprising:

a buffer layer disposed directly on a surface of the nonlayered substrate and having a dopant comprising aluminum that forms aluminum-oxygen complexes within the buffer layer;

a channel layer over the buffer layer;

a barrier layer over the channel layer;

a gate contact disposed on a surface of the epitaxial layers;

a source contact disposed over the surface of the epitaxial layers;

a drain contact disposed on the surface of the epitaxial layers, wherein the source contact and the drain contact are spaced apart from the gate contact and each other; and wherein the buffer layer comprises gallium nitride.

2. The HEMT device of claim 1 wherein the concentration of aluminum within the buffer layer is between 0.5% and 0.75%.

3. The HEMT device of claim 1 wherein the concentration of aluminum within the buffer layer is between 0.75% and 1.25%.

4. The HEMT device of claim 1 wherein the concentration of aluminum within the buffer layer is between 1.25% and 2%.

5. The HEMT device of claim 1 wherein the concentration of aluminum within the buffer layer is between 2% and 3%.

6. The HEMT device of claim 1 wherein the buffer layer is laterally divided into a doped region having the dopant comprising aluminum and an undoped region.

7. The HEMT device of claim 6 wherein the concentration of aluminum within the doped region is between 0.5% and 0.75%.

8. The HEMT device of claim 6 wherein the concentration of aluminum within the doped region is between 0.75% and 1.25%.

9. The HEMT device of claim 6 wherein the concentration of aluminum within the doped region is between 1.25% and 2%.

10. The HEMT device of claim 6 wherein the concentration of aluminum within the doped region is between 2% and 3%.

11. A method of fabricating a high electron mobility transistor (HEMT) device having a nonlayered substrate, method comprising:

forming epitaxial layers over the nonlayered substrate comprising steps of:

disposing a buffer layer directly on a surface of the nonlayered substrate, the buffer layer having a dopant comprising aluminum that forms aluminum-oxygen complexes within the buffer layer;

disposing a channel layer over the buffer layer;

disposing a barrier layer over the channel layer;

forming a gate contact on a surface of the epitaxial layers;

forming a source contact over the surface of the epitaxial layers;

forming a drain contact over the surface of the epitaxial layers, wherein the source contact and the drain contact are spaced apart from the gate contact and each other; and wherein the buffer layer comprises gallium nitride.

12. The method of claim 11 wherein the concentration of aluminum within the buffer layer is between 0.5% and 3%.

13. The method of claim 11 wherein the concentration of aluminum within the buffer layer is between 0.5% and 0.75%.

14. The method of claim 11 wherein the concentration of aluminum within the buffer layer is between 0.75% and 1.25%.

15. The method of claim 11 wherein the concentration of aluminum within the buffer layer is between 1.25% and 2%.

16. The method of claim 11 wherein the concentration of aluminum within the buffer layer is between 2% and 3%.

17. The method of claim 11 further comprising laterally dividing the buffer layer into a doped region having the dopant comprising aluminum and an undoped region.

18. The method of claim 17 wherein the concentration of aluminum within the doped region is between 0.5% and 0.75%.

19. The method of claim 17 wherein the concentration of aluminum within the doped region is between 0.75% and 1.25%.

20. The method of claim 17 wherein the concentration of aluminum within the doped region is between 1.25% and 2%.

21. The method of claim 17 wherein the concentration of aluminum within the doped region is between 2% and 3%.

* * * * *